United States Patent [19]

Yoshikawa

[11] 4,410,800
[45] Oct. 18, 1983

[54] ELECTRON BEAM EXPOSURE SYSTEM

[75] Inventor: Ryoichi Yoshikawa, Yokohama, Japan

[73] Assignee: Tokyo Shibaura Denki Kabushiki Kaisha, Kawasaki, Japan

[21] Appl. No.: 302,983

[22] Filed: Sep. 17, 1981

[30] Foreign Application Priority Data

Sep. 17, 1980 [JP] Japan .................... 55-128843

[51] Int. Cl.³ .................. H01J 37/00; G21K 5/10
[52] U.S. Cl. .................. 250/442.1; 250/492.2; 219/121 E
[58] Field of Search .......... 250/398, 442.1, 492.2; 219/121 EM, 121 E

[56] References Cited

U.S. PATENT DOCUMENTS

| | | | |
|---|---|---|---|
| 3,900,737 | 3/1975 | Collier et al. | 250/492.2 |
| 4,063,103 | 12/1977 | Sumi | 250/442.1 |
| 4,147,937 | 4/1979 | Buelow et al. | 250/492.2 |

*Primary Examiner*—Bruce C. Anderson
*Attorney, Agent, or Firm*—Oblon, Fisher, Spivak, McClelland & Maier

[57] ABSTRACT

In an electron beam exposure system, a table on which a target was mounted is accelerated in Y direction and then decelerated. During this movement, the speed of the target is detected. An electron beam which is directed to the target is deflected in X direction at a constant deflection rate by X deflection electrodes. The electron beam which passed through the gap between the X deflection electrodes is deflected by Y deflection electrodes at a deflection rate and from a deflection starting point in Y direction during the period of acceleration and deceleration. The electron beam then lands on the target. The deflection rate and the deflection starting point are determined by the moving speed of the table so as to draw on the table a straight line extending in the X direction. Thus, the target is exposed at high speed with high accuracy.

8 Claims, 6 Drawing Figures

ELECTRON BEAM EXPOSURE SYSTEM

BACKGROUND OF THE INVENTION

This invention relates to an electron beam exposure system which exposes a target mounted on a table such as a wafer or a photomask, using an electron beam, at a high speed and with a high accuracy in order to draw a desired circuit pattern on the target.

Recently electron beam exposure systems of various types have been developed, which minutely process a target such as a semiconductor wafer or a photomask. Of these systems, the electron beam exposure system of the hybrid raster scanning type is said to be one of the most advantageous system in respect of drawing speed and accuracy. The system of this type, however, is disadvantageous in that both the drawing speed and the drawing accuracy are limited. Particularly, the drawing speed cannot be so much increased.

In an electron beam exposure system of the conventional hybrid raster scanning type, a target mounted on a table is exposed to an electron beam as the table is moved in +Y direction at a constant speed. The beam is deflected at a predetermined angle $\theta$ to an X direction normal to +Y direction. The deflection angle $\theta$ is determined by a scanning speed at which the electron beam scan the target and by the speed at which the table is moved. The angle $\theta$ is such that the locus of the electron beam, which is projected on the target, extends in X direction. The angle $\theta$ is not varied since the beam scans the target at a constant speed and the table is moved at a constant speed. Another system of the hybrid raster scanning type is disclosed in Japanese Patent Disclosure (Kokai) No. 117685/1979 published on Sept. 12, 1979, in which the deflection angle $\theta$ is changed according to deviations of the speed at which the table is moved. As the table is moved in +Y direction at a speed, one frame is drawn on the target mounted on the table. Upon completion of the drawing of the frame, the table is decelerated and is then moved on step in X direction for a distance equal to the scanning pitch. Then the table is accelerated in −Y direction to reach a constant speed. During the table is moved in −Y direction at the constant speed, the next frame is exposed. This sequence of operations is repeated until the entire surface of the target is exposed to the beam and the desired circuit pattern is drawn on the target.

In the system described in the preceding paragraph the table may be moved at an increased speed in order to shorten the time to expose the target to an electron beam. If the table is moved too quickly, however, the circuit pattern will not accurately be drawn on the target. Besides, the system must be large. It will be described why these problems arise in the conventional system.

As mentioned above, the table is moved at a constant speed while the electron beam scans the target to draw one frame of a desired circuit pattern, and upon drawing the frame the table is decelerated and then accelerated. Such rapid deceleration and acceleration of the table are undesirable. They would damage the mechanism for moving the table and would render the same gradually unstable. Accordingly, both the deceleration and the acceleration must be slowed down. For moving the table at a high constant speed, the acceleration and deceleration periods must be relatively long. Thus the time required for exposing the entire target cannot be shortened even if the table is moved in +Y direction at a relatively high speed. If the deceleration and acceleration periods are relatively long, a larger space is required, in which the table is moved. If a larger space is required, a housing defining the space must be proportionally large. For this reason the system has to be large.

Furthermore, if the table is moved in +Y direction at a higher speed, a more time lag is inevitable between the detection of the table and the start of electron beam control. The longer is such time lag, the more will be deteriorated the exposure accuracy.

SUMMARY OF THE INVENTION

It is an object of the present invention to provide an electron beam exposure system which can expose a target and draw a prescribed circuit pattern on the target by an electron beam at high speed and high accurately.

According to the electron beam exposure system of the present invention, a table is accelerated and decelerated by moving means and a target mounted on the table is correctly exposed to an electron beam even in periods of acceleration and deceleration of the table. Therefore, an exposure time which is necessary to complete the exposure of the target is shortened. The electron beam emitted from an electron gun is deflected by deflection means and scans the target. This deflection means deflects the electron bean at a variable deflection rate from a variable deflection starting point. The deflection rate and deflection starting point are determined according to the moving speed of the table. Thus, high accurate circuit pattern is drawn on the target.

DETAILED DESCRIPTION OF THE PREFERRED EMBODIMENT

Figure 1:
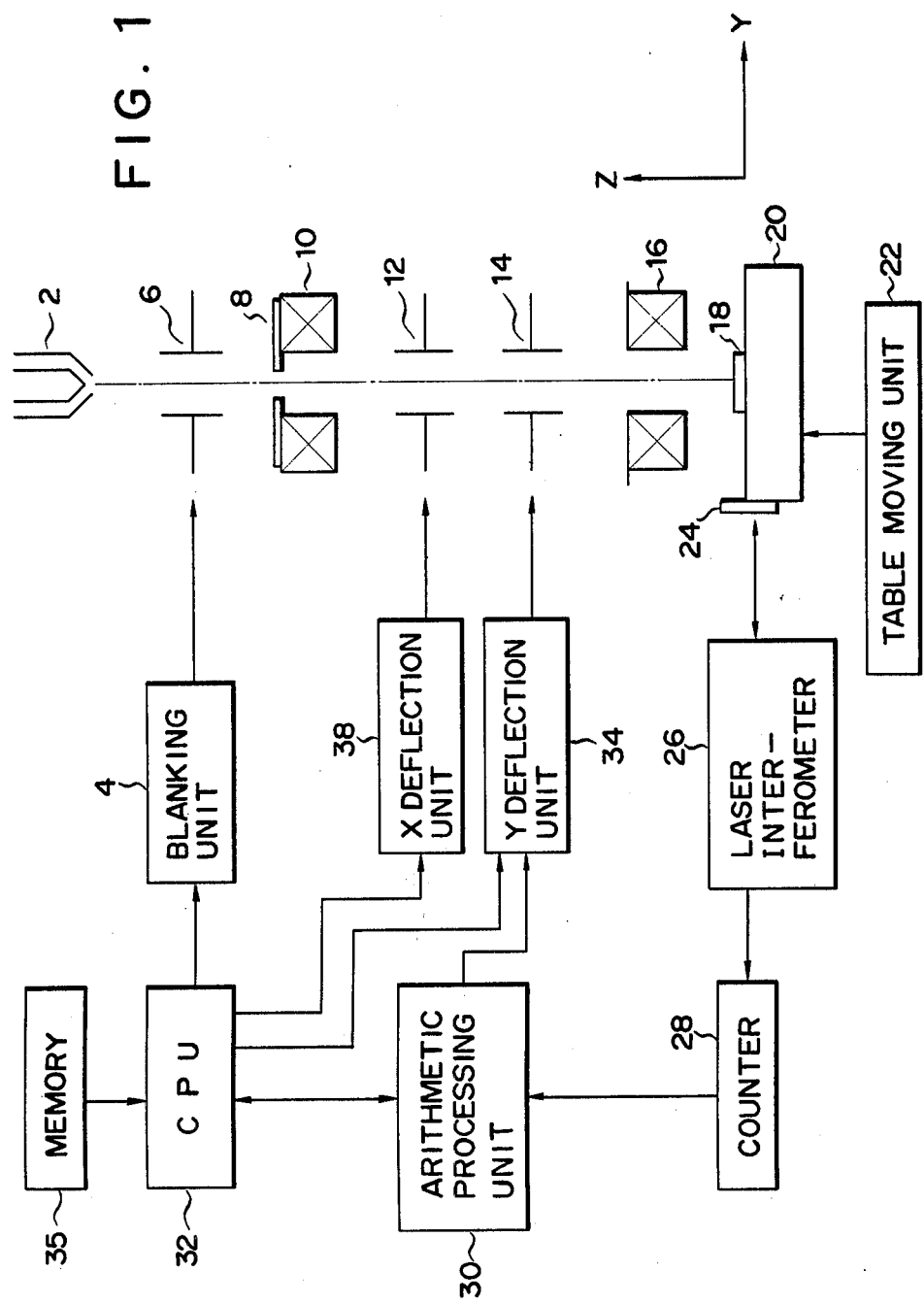
FIG. 1 is a block diagram which schematically shown an electron beam exposure system of the present invention.

Referring to FIG. 1, there is schematically shown an electron beam exposure system of a hybrid raster scanning type according to the present invention. When a blanking signal is supplied to blanking electrodes 6 from a unit 4, the blanking electrodes 6 deflects an electron beam which is emitted from an electron gun 2 deflects to interrupt the passing of the electron beam, and when an unblanking signal is supplied from the blanking unit 4, the electron beam is passed through between the blanking electrodes 6. The electron beam is then converged by a condenser lens 10 with the beam pattern arranged by an aperture 8 and is directed in X and Y deflection electrodes 12 and 14. The electron beam is deflected in X and Y directions. It is deflected at a desired angle θm in X direction as described in detail hereinafter. The electron beam is then focused by an objective or condenser lens 16 and is finally projected on a surface of a target 18.

Figure 2:
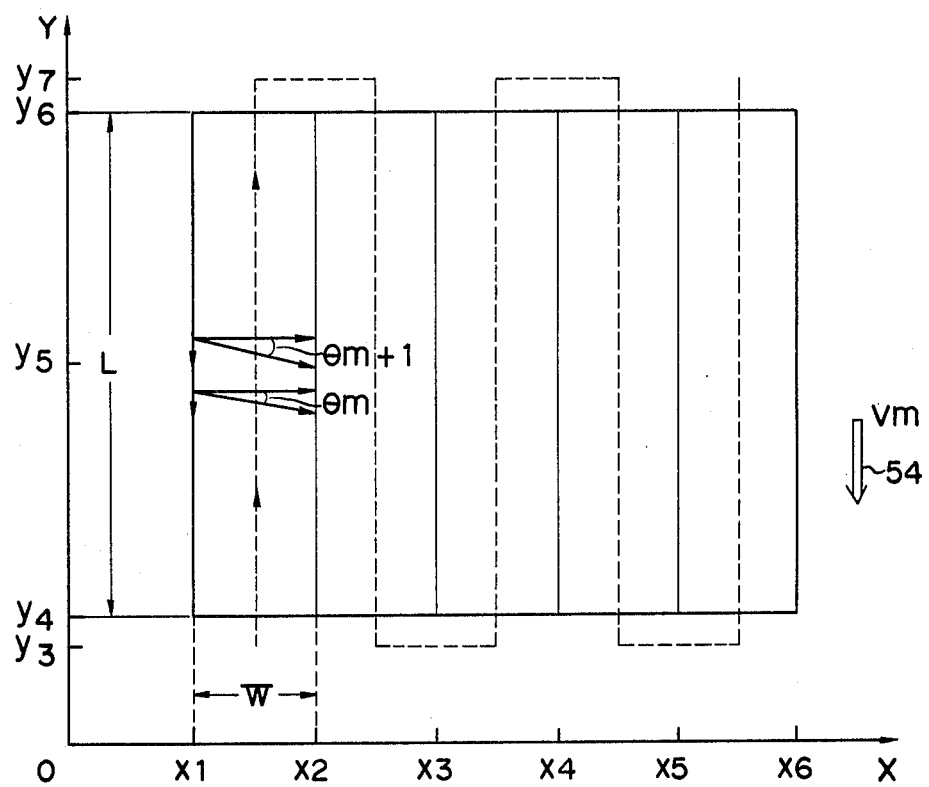
FIG. 2 is a plan view which schematically shows the order to expose an area on the target shown in FIG. 1.
Figure 3A:
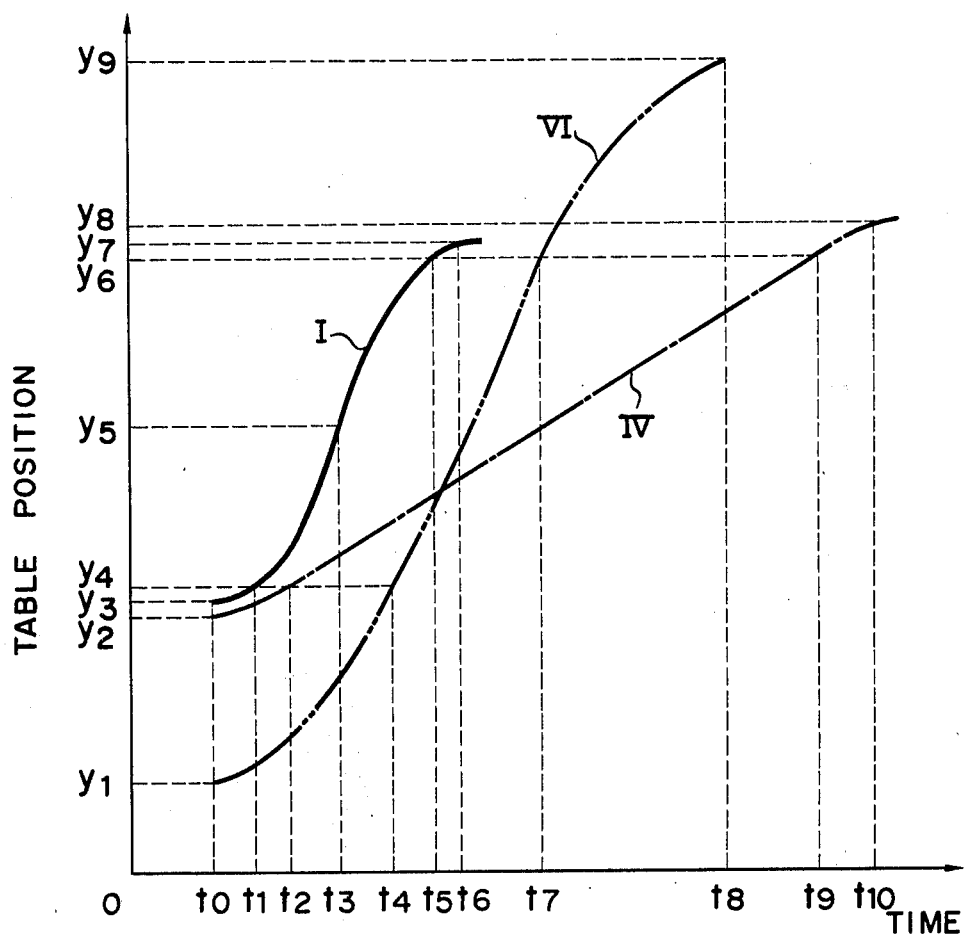
FIG. 3A is a graph which shows a relationship between the table position of the table and the time, wherein curve I illustrates an example of the present system and curves IV and VI show the examples of the conventional system.
Figure 3B:
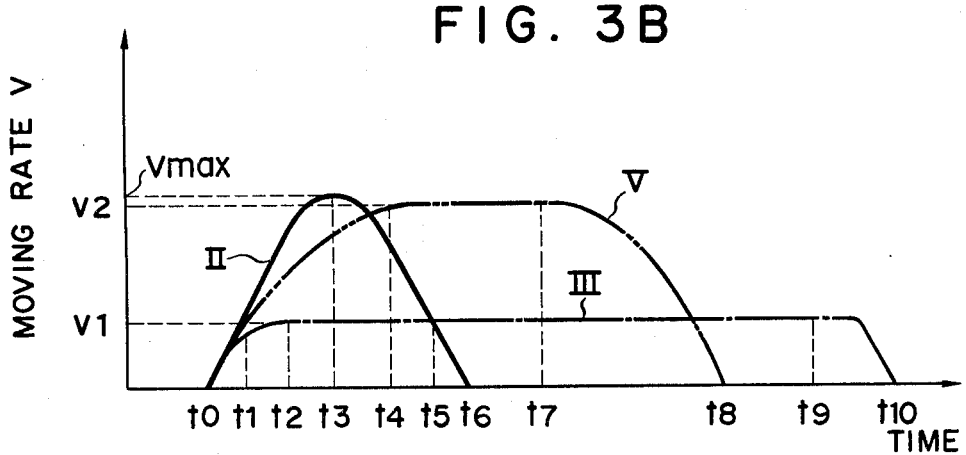
FIG. 3B is a graph which shows a relationship between a moving rate of the table and the time, wherein curve II shows an example of the present system and curves III and V show the examples of the conventional system.

A table 20, on which the target 18 is mounted, is moved in Y and X directions by means of a table moving unit 22 which includes a servo motor and a moving mechanism and the like. As illustrated in FIG. 2, an exposure area or a frame of the target 18 has a length L (Y direction) and a width W (X direction). When the table 20 starts moving in −Y direction at time t0, driven by the table moving unit 22, the position where the electron beam can lead on the target 18 continuously changes from position y3 to position y7 as designated in the curve I of FIG. 3A. The table 20 is stopped at position y7 at time t6. As shown in the curve II of FIG. 3B, the table 20 is accelerated at about a constant rate during the period from the time t0 to time t3. At last it reaches to the maximum speed at time t3 and at position y5. Then, the table 20 is decelerated at a constant rate until it is stopped at time t6.

In the system of the present invention, the target 18 is scanned by the electron beam even during the period of acceleration and deceleration of the table. That is, the scanning is started at the time t1 in the acceleration period and the drawing of one frame ends at time t5 in the deceleration period. After the drawing of one frame ends, during the deceleration period between time t5 and time t6 or after time t6 the table moving unit 22 shifts the table 18 only by frame width W, so that the electron beam can no longer land on the area between the positions x1 to x2 and can land on the area between the positions x2 to x3 instead. This area is exposed to the electron beam even during the period of acceleration and deceleration of the table in the same manner as described before. However, the moving direction of the table is changed from −Y direction to +Y direction and the target is exposed over the distance between positions of y6 and y4.

Referring to FIG. 1 again, an optical reflector 24 such as corner cube, cat's eye or the like is provided on the side of the table 20 and a laser beam is directed from a laser interferometer 26 to the reflector 24. The laser interferometer 26 receives the laser beam reflected by the optical reflector 24. Then the interferometer 26 detects an interference fringe obtained by both the laser beam generated in the interferometer 26 and the laser beam reflected from the reflector 24 and converts this interference fringe into an electric pulse signal. By counting such electric pulse signals by a counter 28, the information of the position and moving speed in Y direction of the table 20 can be obtained. Another optical reflector (not shown) may be likewise provided on another side of the table 20. Another laser interferometer and counter may be prepared for this reflector. By using them, the position in X direction of the table 20 can also be detected. An arithmetic processing unit 30 which receives an output signal from the counter 28 calculates the moving speed V of the table 20 and the position in Y direction of the target 18 where the beam can land. The unit 30 supplies position data to a CPU 32 and supplies moving speed data to a Y deflection unit 34. A memory 35 stores data which represent a desired circuit pattern. Using the position data as an address, the CPU 32 reads out a pattern data from the memory and decodes the pattern data to a circuit pattern signal. The circuit pattern signal is supplied to the blanking unit 4. In response to the circuit pattern signal the blanking unit 4 supplies either a blanking or an unblanking signal to the blanking electrodes 6, whereby the electrode 6 controls the electron beam. The X deflection unit 38 supplies the deflection signal to the X deflection electrodes on the basis of the X deflection rate signal which indicates the deflection rate in X direction of the electron beam supplied from CPU 32. Consequently, the electron beam is deflected at a constant deflection rate.

Figure 4:
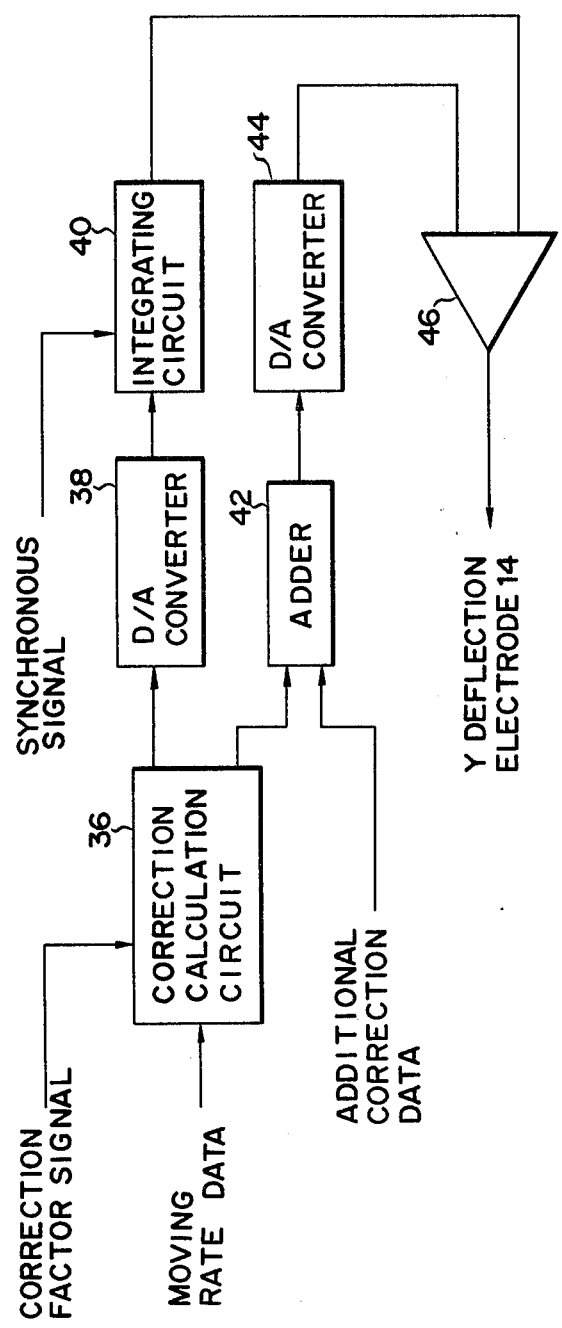
FIG. 4 is a block diagram which shows an example of a circuit which is involved in Y deflection unit shown in FIG. 1.

Y deflection unit 34 which includes a circuit shown in FIG. 4 adjusts, according to the moving speed of the table 20, the deflection rate in Y direction of the electron beam and the deflection starting position of the electron beam in Y direction. The constant correction factor signal is supplied from CPU 32 to the correction calculation circuit 36. Further, the moving rate data is supplied from the arithmetic processing unit 30 to the circuit 36. The circuit 36 calculates the correction value $\pm V\eta$ by multiplying the moving rate $\pm V$ in Y direction by the constant correction factor $\eta$. When the table 20 is moved to +Y direction, the moving speed +V is detected and multiplied. When the table is moved to −Y direction, the moving speed −V is detected and multiplied. The correction signal supplied from the correction calculation circuit 36 is converted into an analog signal by a first D/A converter 38. The analog signal is given to an integrating circuit 40. The integrating circuit 40 synchronizes with a synchronous signal supplied from CPU 32 and generates a sawtooth waveform signal having a slope corresponding to the level of the correction signal, i.e. the moving speed V of the table 20. A correction signal is supplied from the correction calculation circuit 36 through an adder 42 to a second D/A converter 44 and is converted into a reference voltage signal having a certain level corresponding to the correction signal. The reference voltage signal and the sawtooth waveform signal are supplied to the adder 46. The output signal of the adder 46 is applied to the Y deflection electrodes 14 as a Y deflection signal. The deflection rate in Y direction of the electron beam which passes through the gap between the Y deflection electrodes 14 depends on the slope of the sawtooth waveform signal in the Y deflection signal. And the deflection starting point of the electron beam in the Y deflection electrodes 14 depends on the level of the reference voltage in the Y deflection signal. An additional correction data is supplied from CPU 32 to the adder 42, in addition to the correction signal. However, this additional correction data may not be supplied. The additional correction data revises the deflection starting point of the electron beam. For instance, it may revise a deflection starting point in Y direction of the electron beam if a diameter of the electron beam was changed.

According to the above-mentioned circuit as shown in FIG. 4, the deflection of the electron beam is controlled in the following way. In a period between the time when the table 20 starts moving and time t1 when an exposure begins, the supply of the electron beam to the deflection electrodes 12 and 14 is obstructed by the blanking electrodes 6. When the table starts moving, the data representing the moving speed V of the table are given one after another to the correction calculation circuit 36. The X deflection electrodes 12 generate an electric field which can deflects the electron beam at a constant deflection rate determined by the CPU 32. The Y deflection electrodes 14 generate an electric field which can deflects the electron beam from the deflection starting point of the electron beam which has been revised by the deflection rate according to the moving rate V. As an electron beam enters passes through the gap between the X deflection electrodes 12 at time tm as shown in a mark 48 of FIG. 5, it is deflected in X direction at a constant deflection rate. Then, the electron beam passes through the gap between the Y deflection electrodes 14 and is deflected in Y direction during the period between time tm and time tm+1 at the deflection rate which is obtained from the table speed Vm detected at the position ym and at the time (tm−td). A time delay td occurs during the period from the time when the moving speed is detected by the interferometer 26 to the time when the deflection signal is given to the Y deflection electrodes 14. Within this time lag td the table 20 has moved only Δym from the position ym. This moving error is deleted by a position correcting signal, that is, a reference voltage signal which is included in the deflection signal. That is, the deflection rate is determined by the sawtooth waveform, and the deflection starting position is set up on the point corresponding to the position ym by the reference voltage signal. As shown in a mark 50, the electron beam is deflected by the Y deflection electrode 14. Consequently the electron beam is deflected with a predetermined deflection angle $\theta m$ in X direction as shown in a mark 52. Now, since the target 18 is moved at a speed of Vm as shown by a mark 54, the locus of the electron beam projected on the target being scanned by the electron beam is a straight band in X direction as shown in a mark 56. Similarly, the target 18 is also scanned by the electron beam even at time tm+1 and at the position ym+1. Needless to say, if the table moving speed at the position ym+1 is high, the deflection rate of the electron beam to scan its position increases, and the revising amount Δym+1 its Y direction also increases.

Figure 5:
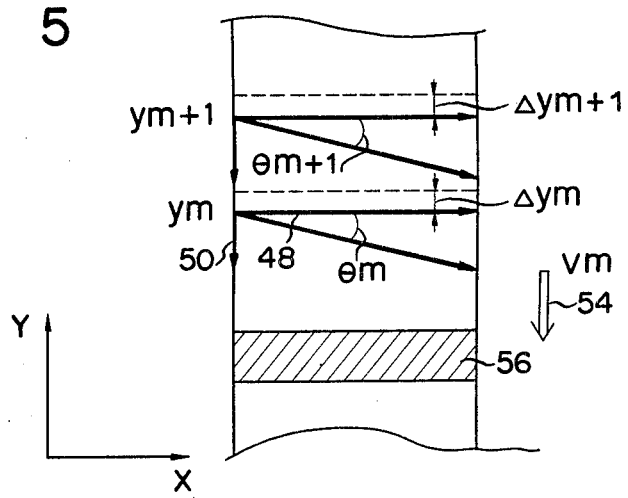
FIG. 5 is a plan view which shows a relationship between a deflection rate in X direction and a deflection rate in Y direction and the starting position of the deflection in Y direction.

While the table 20 is moved in −Y direction, the electron beam is deflected in −Y direction at the predetermined deflection rate as illustrated in FIG. 5 from the deflection starting point which has been revised in −Y direction. On the other hand, while the table 20 is moved in +Y direction, the electron beam is deflected in +Y direction and the revised deflection starting point is shifted in +Y direction. As stated above, according to the system of the present invention, the table 20 is accelerated and decelerated, the deflection angle $\theta$ is changed in response to the moving speed V of the table 20, and the deflection starting position in Y direction is revised, so that the exposure time or the process time of the target can be shortened and a desired highly accurate pattern can be drawn. In the conventional system, the target is exposed while moving at a constant speed, and the deflection angle $\theta$ is kept to be almost constant. Therefore, the time which is necessary to complete the exposure is long and the moving distance of the table becomes long unlike in the system of the present invention, as illustrated in the characteristic curves II~VI shown in the drawings of FIGS. 3A and 3B. The curve III shows an example when the moving speed of the table is not so high, and the curve IV shows a moving distance of the table at that speed. As evident from the comparison between the curve IV and the curve I, the moving distances of the table are not so different. Nevertheless, as evidently from the curve II and the curve III, the exposure completing time becomes long. The curve V is a moving speed curve in the conventional system when the moving speed of the table is made high. But as evident from this curve V, the period (t0 to t4) during which the table accelerated to the constant speed and the period (t7 to t8) during which the table is decelerated to stop are too long to shorten the exposure time sufficiently. In addition, as shown in the curve VI, the moving distance of the table must be long. The housing to keep the space airtight, in which the table moves, inevitably becomes big.

According to the experiment by the present inventors, when a moving speed (a maximum speed) is 80 mm/sec and a drawing area of a target 18 is 5 cm+5 cm, exposure time of 280 seconds is needed in the conventional system which does not expose a target while the table 20 is accelerated and decelerated. When the exposure was performed also during the acceleration and deceleration periods by the system of the present invention, the exposure time was reduced to 200 seconds. Furthermore, it was confirmed that there was no error of the exposed pattern. This experiment showed that the high speed movement of the table 20 could bring further shortening of the exposure time.

This invention is not limited to the embodiment mentioned above. For example, by detecting a position of the table at the real time instead of detecting a moving speed of aforementioned table, the deflection direction and deflection position of aforementioned electron beam may be varied according to this detected position information. Although it is described above that the revising calculation circuit 36 is merely a circuit in which the speed data is multiplied by the coefficient if non-linear revising calculation is needed to the speed data or the forecasting calculation of higher degree of the table speed value is done, the revising calculation circuit 36 may have a high revising calculation function. Moreover, the circuit 36 shown in FIG. 4 is merely an example. Needless to say, the circuit 36 can be changed to various kind of the circuit which performs the similar function. In the aforementioned embodiment, a deflecting plate is used to change the scanning deflection of the electron beam, but the magnetic field deflection by using a electromagnetic coil may also be available. In this case, the deflection direction and the deflection position of the electron beam may be changed by varying a driving deflection current of the electromagnetic coil. Furthermore, in respect to the electro-optical system consisting of the aforementioned electron gun, aperture, deflection system, lens, etc., many types of chamber system such as variable-beam shaped type or the like can be used. Apparently, the table 20 may be continuously moved at the maximum constant speed during a predetermined period after it has been accelerated by the table moving unit 22. Thereafter the table 20 may be decelerated and may then be stopped. If this is the case, the speed of the table 20 may be detected all the time the table 20 is accelerated, moved at the constant speed and decelerated, so that the deflection direction and the deflection starting point are changed according to the moving speed detected. Alternatively, both the deflection direction and the deflection starting point may be kept unchanged only during the period the table 20 moves at the constant speed. Modifications and variations of the present invention are possible to perform without departing from essentials thereof.

As described in detail hereinbefore, according to the present invention, since the moving speed or the position of the table is detected and the deflection direction, and the deflection position of the electron beam are varied according to the this detected value, the drawing exposure can be carried out even during the acceleration and deceleration periods which are long to cope with the high speed movement of the tables, and it is possible to provide the electron beam exposure device which can expose a target at high speed and with high accuracy.

What is claimed is:

1. An electron beam exposure system of hybrid raster scanning type, comprising:
   an electron gun for emitting an electron beam;
   means for mounting a target to be exposed to the electron beam;
   means for accelerating the mounting means in a predetermined direction for a predetermined time and then decelerating the mounting means for a predetermined time;
   means for detecting the moving speed of the mounting means and generating an electric signal corresponding to the moving speed detected;
   means for deflecting the electron beam from a deflection starting point in a deflection direction, both said deflection starting point and said deflection direction being variable;
   means connected to receive the electric signal from the detecting means for generating, according to the electric signal, a deflection signal which defines the deflection starting point and the deflection direction and supplying the deflection signal to the deflecting means; and
   means for directing the electron beam through the deflecting means to the target for an exposure time including at least a fraction of the time of acceleration and deceleration of said mounting means.

2. An electron beam exposure system according to claim 1, wherein said directing means includes means for blanking the electron beam emitted from the electron gun.

3. An electron beam exposure system according to claim 1, wherein said deflecting means includes first deflection electrodes for deflecting said electron beam in X direction at a constant deflection rate and second deflection electrodes for deflecting the electron beam in Y direction normal to said X direction at a variable deflection rate and by and from a variable deflection starting position which are determined by the electric signal from said detecting means.

4. An electron beam exposure system according to claim 1, wherein said moving means accelerates and decelerates said mounting means in Y direction shifts said mounting means only a predetermined distance in X direction normal to Y direction after moving it a predetermined distance in Y direction.

5. An electron beam exposure system according to claim 1, wherein said mounting means is accelerated at a substantially constant rate.

6. A method for exposing a target comprising:
   moving a target acceleratedly and deceleratedly in the prescribed direction;
   determining a deflection direction and a deflection starting position of the electron beam in accordance with the moving speed of the target; and
   deflecting the electron beam in the determined direction from the determined position and scanning the target during at least a fraction of the time of acceleration and deceleration of movement of said target.

7. A method for exposing a target according to claim 6, wherein said electron beam is deflected in X direction at a constant rate and is deflected in Y direction normal to X direction from the deflection starting position at the deflection rate which is determined in accordance with the speed of the target.

8. A method for exposing a target according to claim 6, wherein said target is accelerated and decelerated at a substantially constant rate.

* * * * *